United States Patent
Nomura

(10) Patent No.: US 10,460,909 B2
(45) Date of Patent: Oct. 29, 2019

(54) CHARGED PARTICLE BEAM WRITING METHOD AND CHARGED PARTICLE BEAM WRITING APPARATUS

(71) Applicant: NuFlare Technology, Inc., Yokohama-shi (JP)

(72) Inventor: Haruyuki Nomura, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 81 days.

(21) Appl. No.: 15/888,118

(22) Filed: Feb. 5, 2018

(65) Prior Publication Data

US 2018/0269034 A1 Sep. 20, 2018

(30) Foreign Application Priority Data

Mar. 15, 2017 (JP) .................. 2017-050094

(51) Int. Cl.
| | |
|---|---|
| H01J 37/317 | (2006.01) |
| H01J 37/04 | (2006.01) |
| H01J 37/24 | (2006.01) |
| H01J 37/09 | (2006.01) |
| H01J 37/10 | (2006.01) |

(52) U.S. Cl.
CPC ........ *H01J 37/3175* (2013.01); *H01J 37/045* (2013.01); *H01J 37/09* (2013.01); *H01J 37/10* (2013.01); *H01J 37/243* (2013.01)

(58) Field of Classification Search
CPC ...... H01J 37/3175; H01J 37/045; H01J 37/09; H01J 37/10; H01J 37/243
See application file for complete search history.

(56) References Cited

U.S. PATENT DOCUMENTS

| | | | |
|---|---|---|---|
| 2012/0286170 A1* | 11/2012 | Van De Peut | ......... B82Y 10/00 250/397 |
| 2015/0311035 A1* | 10/2015 | Norikane | ............ H01J 37/3174 250/396 R |

FOREIGN PATENT DOCUMENTS

| | | |
|---|---|---|
| JP | 4-303918 | 10/1992 |
| JP | 2004-311809 | 11/2004 |
| JP | 2006-303361 | 11/2006 |
| JP | 2007-67192 | 3/2007 |
| JP | 2010-219444 | 9/2010 |

* cited by examiner

*Primary Examiner* — Nicole M Ippolito
*Assistant Examiner* — Sean M Luck
(74) *Attorney, Agent, or Firm* — Oblon, McClelland, Maier & Neustadt, L.L.P.

(57) ABSTRACT

In one embodiment, a charged particle beam writing apparatus includes a current limiting aperture, a blanking deflector switching between beam ON and beam OFF so as to control an irradiation time by deflecting the charged particle beam having passed through the current limiting aperture, a blanking aperture blocking the charged particle beam deflected by the blanking deflector in such a manner that the beam OFF state is entered, and an electron lens disposed between the current limiting aperture and the blanking aperture. A lens value set for the electron lens is substituted into a given function to calculate an offset time. The offset time is added to an irradiation time for writing a pattern to correct the irradiation time. The blanking deflector switches between the beam ON and the beam OFF based on the corrected irradiation time.

8 Claims, 9 Drawing Sheets

CHARGED PARTICLE BEAM WRITING METHOD AND CHARGED PARTICLE BEAM WRITING APPARATUS

CROSS REFERENCE TO RELATED APPLICATION

This application is based upon and claims benefit of priority from the Japanese Patent Application No. 2017-50094, filed on Mar. 15, 2017, the entire contents of which are incorporated herein by reference.

FIELD

The present invention relates to a charged particle beam writing method and a charged particle beam writing apparatus.

BACKGROUND

With an increase in the packing density of LSIs, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

An electron beam writing apparatus performs writing with a deflector deflecting an electron beam. Examples of the role of beam deflection performed by a deflector include control of the shape and size of a beam shot, control of a shot position, and beam on/off control (blanking). An output voltage from a DAC (digital-analog converter) amplifier is used to drive the deflector.

In the electron beam writing apparatus, an irradiation time is calculated by dividing, by the current density, the dose (the amount of irradiation) which is set for a writing target pattern. A deflecting voltage is applied from a DAC amplifier to a blanking deflector so that the beam is ON during the irradiation time. The rising and falling edges of the output voltage from the DAC amplifier are not step signals. The blanking deflector needs a finite time to switch the beam ON/OFF. Therefore, the irradiation time is different depending on the number of passes (multiplicity) in multiple writing, resulting in a change in the size of a writing pattern depending on the multiplicity.

By repeatedly writing patterns in an overlying manner, multiple writing aims to utilize the effect of averaging so that an error in pattern position accuracy and an error in connection accuracy of patterns, which is produced in a boundary in a deflection region, are alleviated. In the case where a low sensitivity resist is used and where the amount of irradiation for one pass is large, resist scattering may occur and deflector contamination may occur. To avoid such deflector contamination, multiple writing may be also performed.

To reduce a change in the size of a writing pattern depending on the multiplicity, the electron beam writing apparatus is provided with a shot time offset function of adding an offset time to the calculated irradiation time. In the related art, while the offset time is changed, evaluation patterns are written with multiple different multiplicities, and an optimal offset time is determined from the result of size measurement of the evaluation patterns. However, when the amount of lens excitation is changed in accordance with beam adjustment, an optimal offset time is also changed, hindering improvement of writing accuracy. A method of writing evaluation patterns and calculating an optimal offset time for every beam adjustment may be employed. However, this method has a problem of an increase in downtime of the apparatus.

DETAILED DESCRIPTION

In one embodiment, a charged particle beam writing method uses a charged particle beam writing apparatus including an emitting unit, a current limiting aperture, a blanking deflector, a blanking aperture, and an electron lens, the emitting unit emitting a charged particle beam. The current limiting aperture is provided with an opening through which part of the charged particle beam passes, the blanking deflector switches between beam ON and beam OFF so as to control an irradiation time by deflecting the charged particle beam having passed through the current limiting aperture, the blanking aperture blocks the charged particle beam deflected by the blanking deflector in such a manner that the beam OFF state is entered, and the electron lens is disposed between the current limiting aperture and the blanking aperture. The method includes substituting a lens value into a given function and calculating an offset time, the lens value being set for the electron lens, adding the offset time to an irradiation time for writing a pattern, and correcting the irradiation time, and switching between the beam ON and the beam OFF by using the blanking deflector based on the corrected irradiation time.

Hereinafter, an embodiment of the present invention will be described based on the drawings.

First Embodiment

Figure 1:
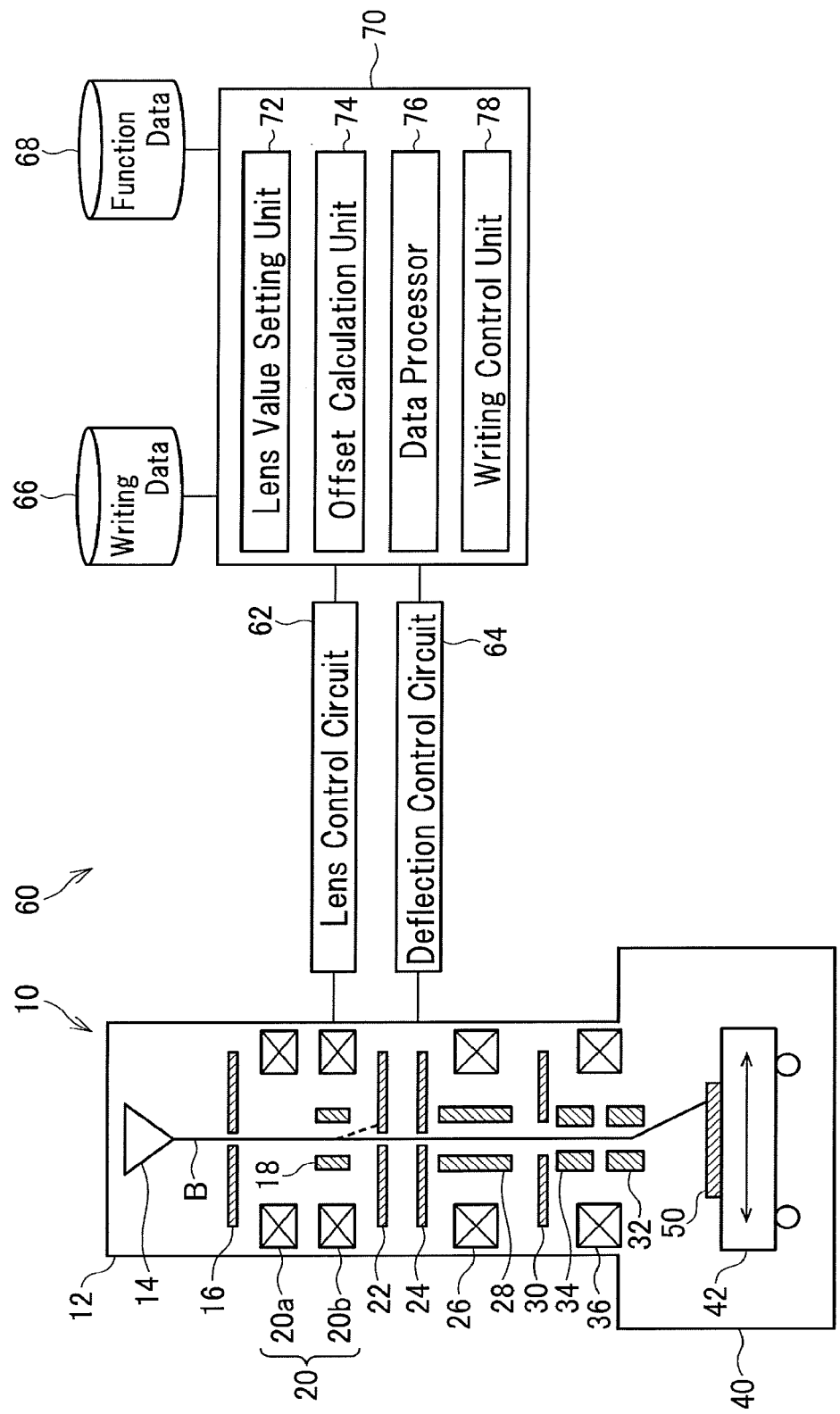
FIG. 1 is a schematic diagram of an electron-beam writing system according to a first embodiment of the present invention.

FIG. 1 is a schematic diagram of an electron-beam writing system according to a first embodiment of the present invention. The electron-beam writing system illustrated in FIG. 1 is a variable shaped writing apparatus including a writing unit 10 and a control unit 60.

The writing unit 10 includes an electron optical column 12 and a writing chamber 40. An electron gun 14, a current limiting aperture 16, a blanking deflector 18, an illumination optical system 20, a blanking aperture 22, a first shaping aperture 24, a projection lens 26, a deflector 28, a second shaping aperture 30, a main deflector 32, a sub-deflector 34, and an objective lens 36 are disposed in the electron optical column 12. As the blanking deflector 18, for example, a pair of electrodes is used.

The current limiting aperture 16 is disposed downstream of the electron gun 14 (emission source) in the optical axis direction (beam traveling direction). For example, an opening of a given size is formed on the optical axis.

The illumination optical system 20 includes an electron lens 20a and an electron lens 20b, and is disposed between the current limiting aperture 16 and the blanking aperture 22. The electron lens 20a is disposed downstream of the current limiting aperture 16 in the optical axis direction. The electron lens 20b is disposed downstream of the electron lens 20a in the optical axis direction.

In the writing chamber 40, an XY stage 42 is disposed. On the XY stage 42, a substrate 50 such as a mask which is a writing target is disposed. The substrate 50 encompasses an exposure mask used in manufacturing a semiconductor device. The substrate 50 also encompasses mask blanks to which a resist has been applied and on which nothing has been written.

The control unit 60 includes a lens control circuit 62, a deflection control circuit 64, storage devices 66 and 68, and a control calculator 70.

The control calculator 70 includes a lens value setting unit 72, an offset calculation unit 74, a data processor 76, and a writing control unit 78. The lens value setting unit 72, the offset calculation unit 74, the data processor 76, and the writing control unit 78 may be configured by using hardware or may be configured by using software.

The lens control circuit 62 controls the lens value (the amount of excitation) of the electron lens 20b, and also controls the lens value of the electron lens 20a in accordance with the lens value of the electron lens 20b.

Figure 2:
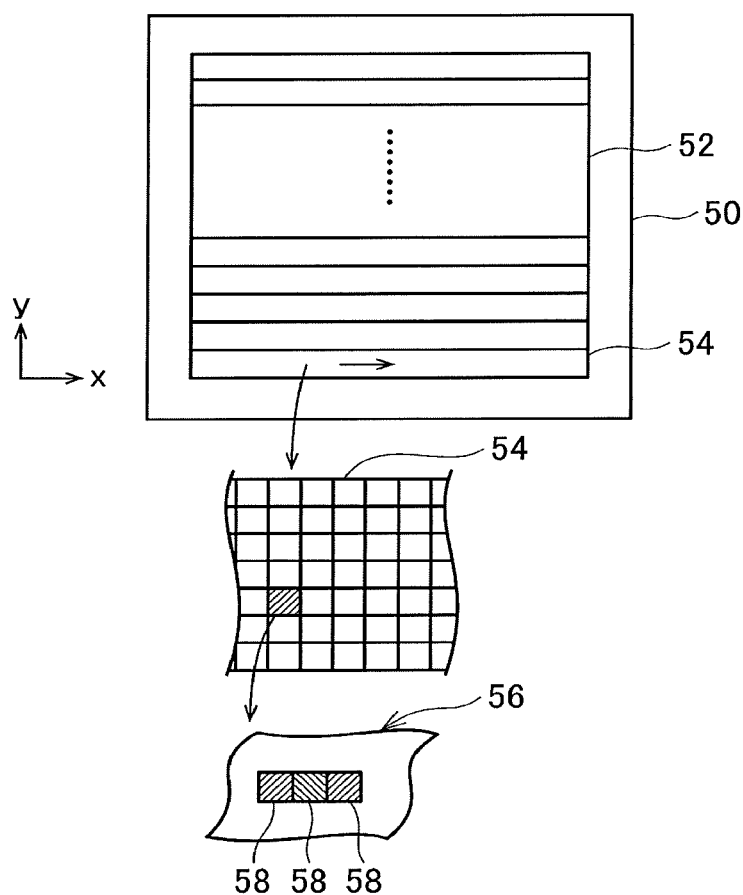
FIG. 2 is a schematic diagram for describing a writing area.

FIG. 2 is a conceptual diagram for describing a writing area. In FIG. 2, a writing area 52 of the substrate 50 is virtually divided into multiple strip-shaped stripe areas 54 depending on the size of the width with which the main deflector 32 may perform deflection in the y direction. Each of the stripe areas 54 is virtually divided into multiple subfields (SFs) 56 depending on the size in which the sub-deflector 34 may perform deflection. Shot FIG. 58 are written at the shot position of each of the SFs 56.

The deflection control circuit 64 applies a corresponding deflecting voltage through a corresponding DAC amplifier (not illustrated) to each of the blanking deflector 18, the deflector 28, the main deflector 32, and the sub-deflector 34, and the amount of deflection is controlled. A deflecting voltage applied to the blanking deflector 18 causes the beam ON/OFF to be switched, and the irradiation time (the amount of irradiation) of each shot is controlled. A deflecting voltage applied to the deflector 28 causes the shape and size of each shot to be controlled. A deflecting voltage applied to the main deflector 32 causes the beam of each shot to be deflected to the reference position of a target SF 56. A deflecting voltage applied to the sub-deflector 34 causes the beam of each shot to be deflected to shot positions in the target SF 56.

The writing apparatus performs a writing process on each stripe area 54. For example, while the XY stage 42 continuously moves in the –x direction, writing is performed on the first stripe area 54 in the x direction. Then, after writing in the first stripe area 54, writing is performed on the second stripe area 54 in a similar manner or in the opposite direction. After that, writing is performed on the third and subsequent stripe areas 54 in a similar manner. The main deflector 32 sequentially deflects the electron beam to the reference positions of the SFs 56 in such a manner that the move of the XY stage 42 is followed. The sub-deflector 34 deflects the electron beam from the reference position of each SF 56 to shot positions of the beam irradiated into the SF 56.

The storage device 66 receives, for storage, writing data (layout data) constituted by multiple graphic patterns from the outside. The storage device 68 stores data about a function for calculating an offset time from the lens value of the electron lens 20b (or the electron lens 20a). The offset time is added to an irradiation time in order to correct the irradiation time. The method of deriving the function and the method of calculating an offset time will be described below.

A part of an electron beam B emitted from the electron gun 14 disposed in the electron optical column 12 passes through the opening provided for the current limiting aperture 16. The remaining part of the electron beam B is blocked by the current limiting aperture 16. In other words, the current limiting aperture 16 limits the emission current emitted from the electron gun 14.

The electron beam B of a current limiting aperture image which has passed through the current limiting aperture 16 converges by using the electron lens 20a, and forms a convergent point. The blanking deflector 18 controls the beam ON/OFF. The blanking aperture 22 blocks an electron beam deflected so that the beam OFF state is entered. That is, in the beam ON state, control is exerted so that the electron beam passes through the blanking aperture 22. In the beam OFF state, deflection is performed so that the entire beam is blocked by the blanking aperture 22.

The electron beam B having passed through the blanking aperture 22 during a period from a time the beam ON state is entered from the beam OFF state to a time the beam OFF state is entered is used as one shot of the electron beam. The blanking deflector 18 controls the direction of the passing electron beam B so that the beam ON state and the beam OFF state arise alternately. For example, in the beam ON state, a deflecting voltage is not applied to the blanking deflector 18. In the beam OFF state, a deflecting voltage is applied to the blanking deflector 18. The irradiation time of each shot is used to adjust the amount of irradiation per shot of the electron beam B irradiated onto the substrate 50.

The electron beam B for each shot which is generated by passing through the blanking deflector 18 and the blanking aperture 22 is irradiated by using the electron lens 20b (illumination lens) onto the entire first shaping aperture 24 having a rectangular opening. The electron beam B passes through the opening of the first shaping aperture 24 so as to form a rectangular shape.

The electron beam B of a first aperture image which has passed through the first shaping aperture 24 is projected by using the projection lens 26 onto the second shaping aperture 30 having an opening(s). At that time, the deflector 28 exerts control so that the first aperture image projected onto the second shaping aperture 30 is deflected. Thus, the shape and size of the electron beam passing through the opening(s) may be changed (subjected to variable formation).

The electron beam B of a second aperture image which has passed through the opening of the second shaping aperture 30 comes into a focus by using the objective lens 36. Then, the electron beam B is deflected by the main deflector 32 and the sub-deflector 34, and is irradiated to the target position of the substrate 50 disposed on the XY stage 42.

A DAC amplifier applying a deflecting voltage to the blanking deflector 18 produces an output voltage of which the rising edge is not a step signal. Accordingly, switching of the beam ON/OFF performed by the blanking deflector 18 needs a certain length of time. Therefore, after an irradiation time is calculated by dividing, by the current density, the dose (the amount of irradiation) which is set for a writing target pattern, an offset time needs to be added to the calculated irradiation time so that the irradiation time is corrected.

Figure 3:
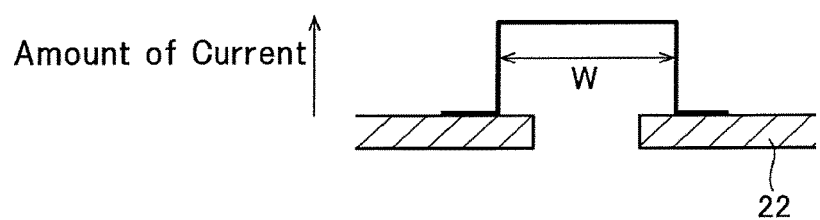
FIG. 3 is a schematic diagram of the distribution of the amount of current on a blanking aperture.

In the present embodiment, the electron beam B of a current limiting aperture image which has passed the current limiting aperture 16 forms an image on the blanking aperture 22. As illustrated in FIG. 3, the distribution of the amount of current of the electron beam on the blanking aperture 22 has steep rising and falling edges. In this case, the beam size W changes depending only on the lens value (excitation value) of the electron lens 20b or 20a of the illumination optical system 20.

That is, the deflection sensitivity of the electron beam on the blanking aperture 22 depends only on the lens value of the electron lens 20b (or the electron lens 20a). Therefore, an optimal offset time may be represented as a function f in which the lens value CL is used as a variable. For example, optimal offset time=f(CL)+(individual differences of the DAC amplifier and the blanking deflector 18).

Figure 4:
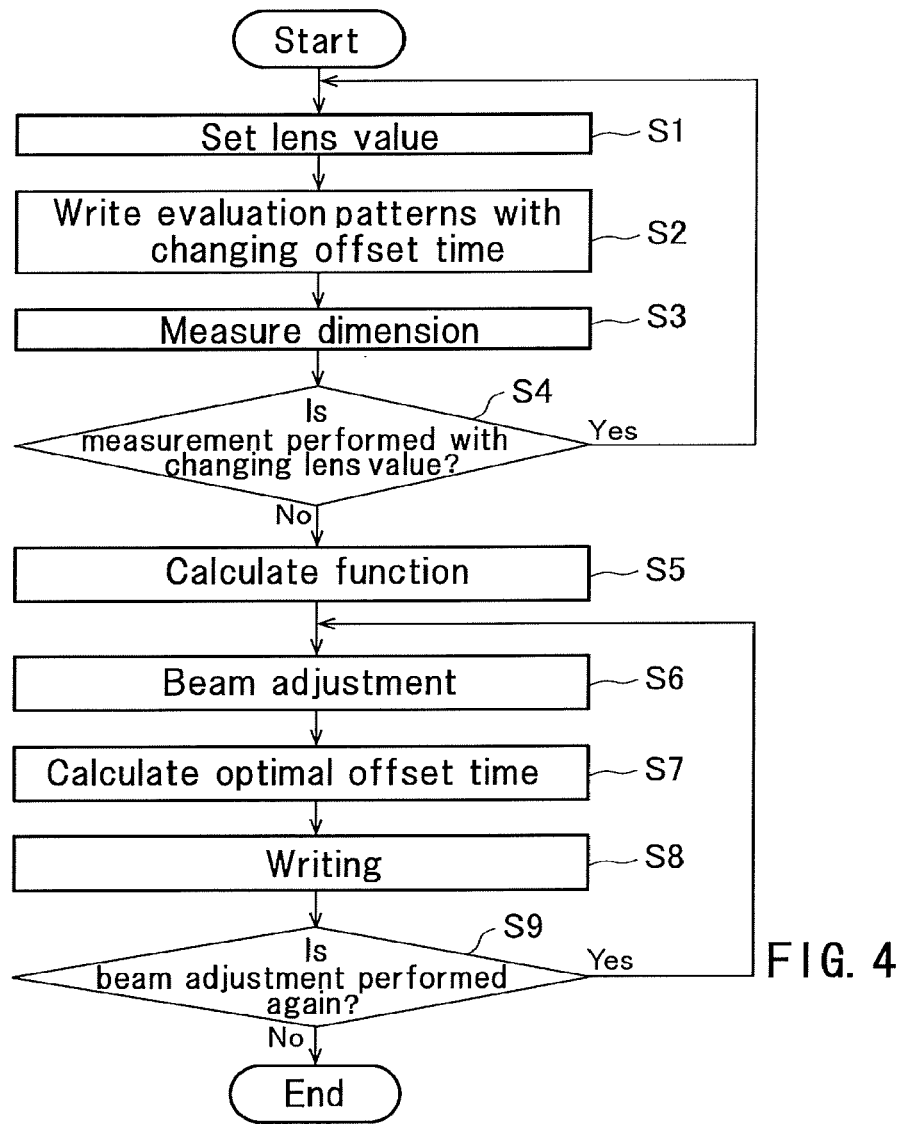
FIG. 4 is a flowchart for describing a writing method according to the first embodiment.

By using the flowchart illustrated in FIG. 4, a method of calculating the function f and setting an optimal offset time for the writing apparatus will be described.

The lens value setting unit 72 sets a certain lens value for the electron lens 20b, and the lens control circuit 62 controls the amount of excitation of the electron lens 20b (step S1). In accordance with the lens value of the electron lens 20b, the lens value of the electron lens 20a is also determined. While setting of an offset time and the number of passes (multiplicity) in multiple writing are changed, multiple evaluation patterns are written on the substrate 50 (step S2). For example, the substrate 50 has a configuration in which a light-shielding film such as a chromium film is formed on a silicon substrate and in which a resist is applied on the light-shielding film.

Figure 5A:
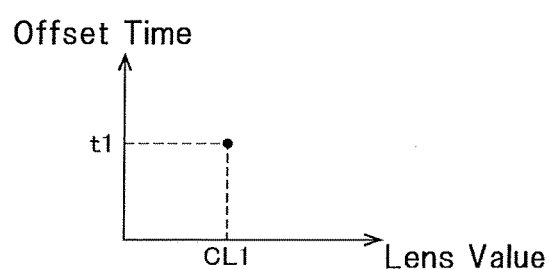
FIGS. 5A and 5B are diagrams illustrating how to obtain a function for calculating an optimal offset time.

A developing process is performed to form a resist pattern which is used as a mask to perform etching. Thus, evaluation patterns are formed on the light-shielding film. The sizes of the evaluation patterns are measured (step S3). The multiple evaluation patterns are written with the different respective offset times and the different respective multiplicities. As illustrated in FIG. 5A, an offset time t1 with which an evaluation pattern for which a change in size depending on the multiplicity is the smallest is written is determined to be an optimal offset time corresponding to the lens value CL1 which is set in step S1.

Figure 5B:
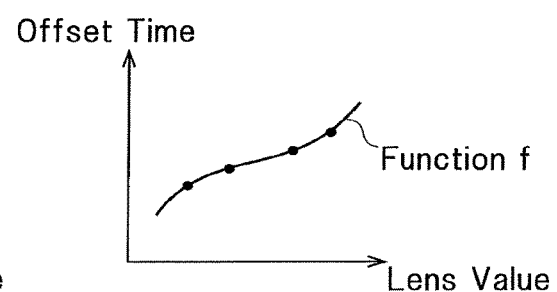

The operation of writing evaluation patterns and determining an optimal offset time is performed multiple times while the lens value is changed (step S1 to S4). To reduce the evaluation time, it is preferable to perform a writing operation, with the lens value being changed, on a single substrate 50 at a time (steps S1, S2, S4) before measurement of the sizes (step S3). As illustrated in FIG. 5B, the function f is calculated from optimal offset times for multiple lens values (step S5). The function f is stored in the storage device 68.

Beam adjustment (such as convergent half-angle adjustment and current density adjustment) before actual writing on products is performed, and the lens value of the electron lens 20b (and the electron lens 20a) is adjusted (step S6). The offset calculation unit 74 extracts the function f from the storage device 68, and substitutes, into the function f, the lens value obtained after the adjustment in step S6. Thus, an optimal offset time is calculated (step S7).

A pattern is written on the substrate 50 (step S8). The data processor 76 reads writing data from the storage device 66, performs several stages of data conversion, and generates, for each shot, shot data specific to the apparatus. The shot data includes information about the shot position, the size, the shape, and the irradiation time. The irradiation time is a time obtained through addition of the optimal offset time calculated in step S7. The generated shot data is output to the deflection control circuit 64. Under control exerted by the writing control unit 78, the deflection control circuit 64 applies a corresponding deflecting voltage to each deflector via a corresponding DAC amplifier.

If the beam adjustment is to be performed again (step S9_Yes), an optimal offset time is calculated again after the lens value is changed in the adjustment (steps S6, S7).

Thus, according to the present embodiment, the function f indicating correspondences between the lens value and the optimal offset time is calculated. When the lens value is changed in the beam adjustment before writing, the changed lens value is substituted into the function f. Thus, an optimal offset time may be efficiently determined with high accuracy.

In the above-described embodiment, in calculation of the function f, evaluation patterns are written with multiple lens value settings, and optimal offset times are detected for the respective lens values. Alternatively, the function f may be calculated from a simulation of deflection sensitivity of the blanking deflector 18 on the blanking aperture 22. Thus, the number of operations of writing an evaluation pattern may be decreased.

In the above-described embodiment, the example in which, while both of the offset time and the number of passes are changed, evaluation patterns are written is described. When a ratio of a change in the size with respect to a change in the amount of irradiation has been found, the operation of writing evaluation patterns with the offset time being changed may be skipped.

The function f may be applied to other writing apparatuses having the same configuration.

Second Embodiment

Figure 6:
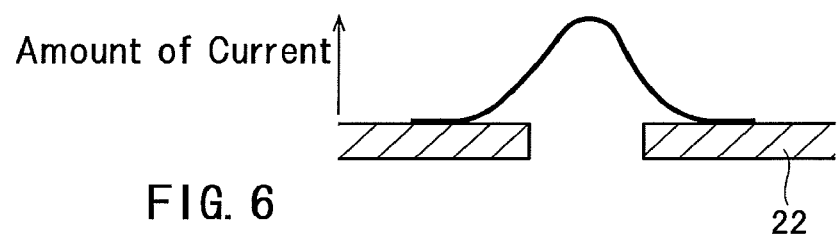
FIG. 6 is a schematic diagram of the distribution of the amount of current on a blanking aperture.

In the above-described first embodiment, the case in which the electron beam B of a current limiting aperture image forms an image on the blanking aperture 22 and in which the distribution of the amount of current on the blanking aperture 22 has steep rising and falling edges as illustrated in FIG. 3 is described. However, there may be a case in which the electron beam B of a current limiting aperture image does not form an image on the blanking aperture 22, and in which the distribution of the amount of current on the blanking aperture 22 is blurred as illustrated in FIG. 6.

Figure 7:
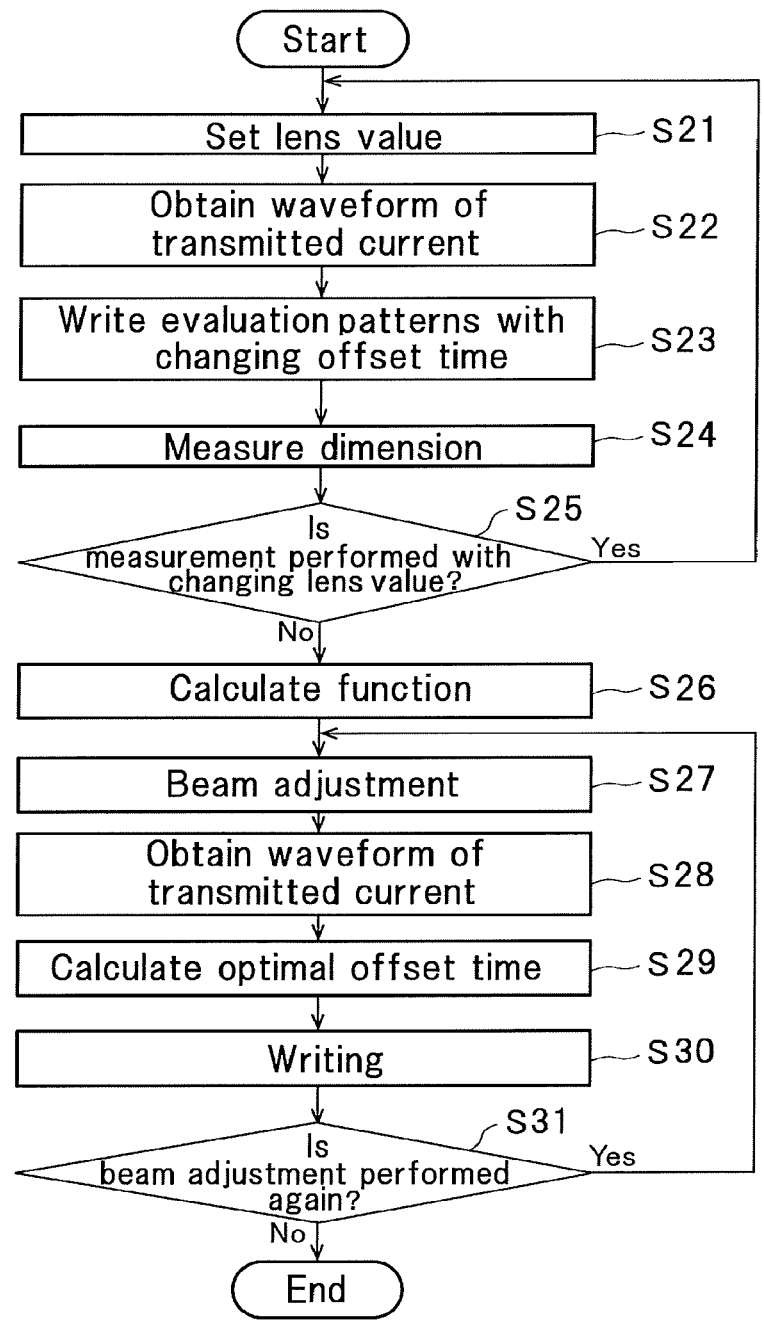
FIG. 7 is a flowchart for describing a writing method according to a second embodiment.

A method, for the case where the distribution of the amount of current thus is blurred, of calculating a function g for calculating an optimal offset time which is set for the writing apparatus will be described by using the flowchart illustrated in FIG. 7.

Figure 8:
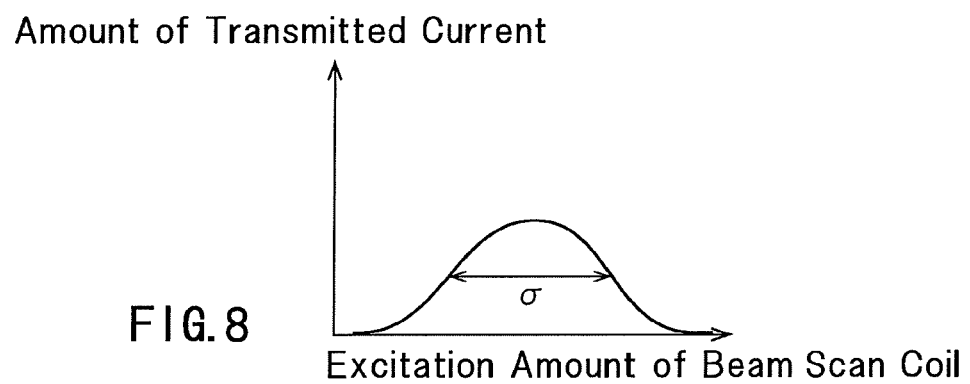
FIG. 8 is a schematic diagram of the distribution of the amount of current of an electron beam having passed through a blanking aperture.

A certain lens value is set for the electron lens 20b (step S21). The electron beam B of a current limiting aperture image is scanned on the blanking aperture 22, and the waveform of the transmitted current as illustrated in FIG. 8 is obtained (step S22). The electron beam may be scanned, for example, by using a beam scan coil disposed near the blanking deflector 18. When any deflecting voltage is capable of being applied to the blanking deflector 18, the amount of deflection performed by the blanking deflector 18 may be controlled, and the electron beam may be scanned.

The amount of current of the electron beam having passed through the blanking aperture 22 (the amount of the transmitted current) is detected by using a detector such as a Faraday cup disposed on the XY stage 42. A transmitted-current detecting aperture may be disposed below the blanking aperture 22. The electron beam having passed through the blanking aperture 22 is deflected by a deflector and is irradiated onto the transmitted-current detecting aperture so that the transmitted current is detected.

The waveform (distribution) of the transmitted current is subjected to fitting using a Gaussian function, and the standard deviation $\sigma$ corresponding to the width of the waveform is calculated.

Then, while setting of an offset time and the number of passes (multiplicity) in multiple writing are changed, multiple evaluation patterns are written on the substrate 50 (step S23). For example, the substrate 50 has a configuration in which a light-shielding film such as a chromium film is formed on a silicon substrate and in which a resist is applied to the light-shielding film.

Figure 9A:
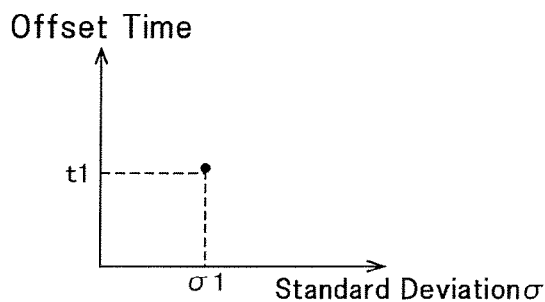
FIGS. 9A and 9B are diagrams illustrating how to obtain a function for calculating an optimal offset time.

A developing process is performed to form a resist pattern which is used as a mask to perform etching. Thus, evaluation patterns are formed on the light-shielding film. The sizes of the evaluation patterns are measured (step S24). The multiple evaluation patterns are written with the different respective offset times and the different respective multiplicities. As illustrated in FIG. 9A, the offset time t1 with which an evaluation pattern for which a change in size depending on the multiplicity is the smallest is written is determined to be an optimal offset time corresponding to the standard deviation $\sigma 1$ obtained from the waveform of the transmitted current obtained in step S22.

Figure 9B:
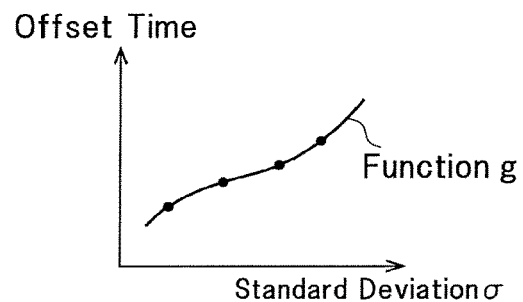

The operation of obtaining the waveform of a transmitted current, writing evaluation patterns, and determining an optimal offset time is performed multiple times while the lens value is changed (steps S21 to S25). To reduce the evaluation time, it is preferable to perform a writing operation, with the lens value being changed, on a single substrate 50 at a time (steps S21 to S23, S25) before measurement of the sizes (step S24). As illustrated in FIG. 9B, the function g is calculated from optimal offset times for multiple standard deviations (step S26). The function g is stored in the storage device 68.

The beam adjustment (such as convergent half-angle adjustment and current density adjustment) before actual writing on products is performed, and the lens values of the electron lens 20b and the electron lens 20a are adjusted (step S27). After the adjustment of the lens values, the electron beam B of a current limiting aperture image is scanned on the blanking aperture 22, and the waveform of the transmitted current is obtained (step S28). The control calculator 70 performs Gaussian fitting on the obtained waveform of the transmitted current, and obtains the standard deviation $\sigma$.

The offset calculation unit 74 extracts the function g from the storage device 68, and substitutes, into the function g, the standard deviation $\sigma$ obtained from the waveform of the transmitted current obtained in step S28. Thus, an optimal offset time is calculated (step S29).

A pattern is written on the substrate 50 (step S30). The data processor 76 reads writing data from the storage device 66, performs several stages of data conversion, and generates, for each shot, shot data specific to the apparatus. The shot data includes information about the shot position, the size, the shape, and the irradiation time. The irradiation time is a time obtained through addition of the optimal offset time calculated in step S29. The generated shot data is output to the deflection control circuit 64. Under control performed by the writing control unit 78, the deflection control circuit 64 applies a corresponding deflecting voltage to each deflector through a corresponding DAC amplifier.

If the beam adjustment is to be performed again (step S31_Yes), the blanking aperture 22 is scanned after change of the lens values in the adjustment so that the waveform of the transmitted current is obtained, and an optimal offset time is calculated again (steps S27 to S29).

Thus, according to the present embodiment, the function g indicating correspondences between the optimal offset time and the standard deviation indicating the spread of the waveform of a transmitted current obtained when the blanking aperture 22 is scanned is calculated in advance. When the lens values are changed in the beam adjustment before writing, the blanking aperture 22 is scanned to calculate the standard deviation of the waveform of a transmitted current, and the calculated standard deviation is substituted into the function g. Thus, an optimal offset time may be efficiently determined with high accuracy.

In the above-described second embodiment, in calculation of the function g, evaluation patterns are written with multiple lens value settings, and optimal offset times for multiple standard deviations $\sigma$ are detected. Alternatively, the function g may be calculated from a simulation of deflection sensitivity of the blanking deflector 18 on the blanking aperture 22. Thus, the number of operations of writing an evaluation pattern may be decreased.

In the above-described second embodiment, the example in which, while both of the offset time and the number of passes are changed, evaluation patterns are written is described. When a ratio of a change in the size with respect to a change in the amount of irradiation has been found, the operation of writing evaluation patterns with the offset time being changed may be skipped.

The function g is a function between the standard deviation $\sigma$ and the optimal offset time. This is not limited to the standard deviation $\sigma$. A function using another index indicating the width of the waveform of a transmitted current, such as a dispersion $\sigma^2$, may be used.

The function g may be applied to other writing apparatuses having the same configuration.

Although the embodiment mentioned above is directed to a case in which electron beams are used as an example of charged particle beams, the charged particle beams are not limited to electron beams but may be ion beams or other types of charged particle beams. Although the embodiment mentioned above is directed to a single beam writing apparatus, a multi-beam writing apparatus may be used.

While certain embodiments have been described, these embodiments have been presented by way of example only, and are not intended to limit the scope of the inventions. Indeed, the novel methods and systems described herein may be embodied in a variety of other forms, furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing method using a charged particle beam writing apparatus including an emitting unit, a current limiting aperture, a blanking deflector, a blanking aperture, and an electron lens, the emitting unit emitting a charged particle beam, the current limiting aperture being provided with an opening through which part of the charged particle beam passes, the blanking deflector switching between beam ON and beam OFF so as to control an irradiation time by deflecting the charged particle beam having passed through the current limiting aperture, the blanking aperture blocking the charged particle beam deflected by the blanking deflector in such a manner that the beam OFF state is entered, the electron lens being disposed between the current limiting aperture and the blanking aperture, the method comprising:

substituting a lens value into a given function and calculating an offset time, the lens value being set for the electron lens;

adding the offset time to an irradiation time for writing a pattern, and correcting the irradiation time; and switching between the beam ON and the beam OFF by using the blanking deflector based on the corrected irradiation time.

2. The charged particle beam writing method according to claim 1, wherein the charged particle beam having passed through the current limiting aperture forms an image on the blanking aperture.

3. The charged particle beam writing method according to claim 1, wherein evaluation patterns are written on a substrate by changing each of the lens value of the electron lens, the offset time, and multiplicity in multiple writing, and wherein optimal offset times are obtained for the respective lens values based on sizes of the evaluation patterns, and the given function indicating correspondence between the lens values and the optimal offset times is calculated.

4. A charged particle beam writing method using a charged particle beam writing apparatus including an emitting unit, a current limiting aperture, a blanking deflector, a blanking aperture, and an electron lens, the emitting unit emitting a charged particle beam, the current limiting aperture being provided with an opening through which part of the charged particle beam passes, the blanking deflector switching between beam ON and beam OFF so as to control an irradiation time by deflecting the charged particle beam having passed through the current limiting aperture, the blanking aperture blocking the charged particle beam deflected by the blanking deflector in such a manner that the beam OFF state is entered, the electron lens being disposed between the current limiting aperture and the blanking aperture, the method comprising:

deflecting the charged particle beam and scanning the blanking aperture;

detecting an amount of current of the charged particle beam having passed through the blanking aperture, and obtaining a waveform of a distribution of the amount of current;

substituting, into a given function, a value corresponding to a width of the waveform, and calculating an offset time;

adding the offset time to an irradiation time for writing a pattern, and correcting the irradiation time; and switching between the beam ON and the beam OFF by using the blanking deflector based on the corrected irradiation time.

5. The charged particle beam writing method according to claim 4, wherein the charged particle beam having passed through the current limiting aperture does not form an image on the blanking aperture.

6. The charged particle beam writing method according to claim 4, wherein, while a lens value of the electron lens is changed, the blanking aperture is scanned with the charged particle beam being deflected, and the value corresponding to the width of the waveform of the distribution of the amount of current is calculated for each lens value, wherein evaluation patterns are written on a substrate by changing each of the lens value of the electron lens, the offset time, and multiplicity in multiple writing, and wherein optimal offset times are obtained for the respective widths of the waveforms of the distribution of the amount of current based on sizes of the evaluation patterns, and the given function is calculated, the given function indicating correspondence between the optimal offset times and the widths of the waveforms of the distribution of the amount of current.

7. A charged particle beam writing apparatus comprising:

an emitting unit that emits a charged particle beam;

a current limiting aperture provided with an opening through which part of the charged particle beam passes;

a blanking deflector that switches between beam ON and beam OFF so as to control an irradiation time, the switching between the beam ON and the beam OFF being performed in such a manner that the charged particle beam having passed through the current limiting aperture is deflected;

a blanking aperture that blocks the charged particle beam deflected by the blanking deflector in such a manner that the beam OFF state is entered;

an electron lens disposed between the current limiting aperture and the blanking aperture;

an offset calculation unit that substitutes, into a given function, a lens value which is set for the electron lens and that calculates an offset time; and a deflection control circuit that controls a deflecting voltage applied to the blanking deflector, on the basis of a corrected irradiation time obtained by adding the offset time to the irradiation time for writing a pattern.

8. The charged particle beam writing apparatus according to claim 7, wherein the charged particle beam having passed through the current limiting aperture forms an image on the blanking aperture.

* * * * *